(12) United States Patent
Oh et al.

(10) Patent No.: US 9,361,848 B2
(45) Date of Patent: Jun. 7, 2016

(54) APPARATUS AND METHOD FOR DRIVING LIQUID CRYSTAL DISPLAY DEVICE HAVING DATA DRIVER WITH TEMPERATURE DETECTOR

(71) Applicant: LG DISPLAY CO., LTD., Seoul (KR)

(72) Inventors: Zong-Gun Oh, Gumi-si (KR); Hak-Su Kim, Daegu (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/067,706

(22) Filed: Oct. 30, 2013

(65) Prior Publication Data

US 2014/0111499 A1    Apr. 24, 2014

(30) Foreign Application Priority Data

Oct. 31, 2012  (KR) ................. 10-2012-0122532

(51) Int. Cl.
*G09G 3/36*     (2006.01)
*H01L 31/0236*  (2006.01)
*H01L 31/048*   (2014.01)
*H01L 31/068*   (2012.01)
*H01L 31/054*   (2014.01)

(52) U.S. Cl.
CPC ........ *G09G 3/3696* (2013.01); *H01L 31/02366* (2013.01); *H01L 31/048* (2013.01); *H01L 31/0543* (2014.12); *H01L 31/068* (2013.01); *Y02E 10/52* (2013.01); *Y02E 10/547* (2013.01)

(58) Field of Classification Search
CPC . G09G 2320/041; G09G 3/3603; G02F 1/132
See application file for complete search history.

(56) References Cited

U.S. PATENT DOCUMENTS

| | | | |
|---|---|---|---|
| 2007/0085806 A1 | 4/2007 | Moon | |
| 2008/0062100 A1* | 3/2008 | Hong et al. | 345/87 |
| 2009/0102779 A1* | 4/2009 | Jo | 345/101 |
| 2009/0278832 A1* | 11/2009 | Cho et al. | 345/211 |
| 2011/0205212 A1 | 8/2011 | Matsumoto et al. | |
| 2013/0169614 A1* | 7/2013 | Huang | 345/212 |

FOREIGN PATENT DOCUMENTS

| | | |
|---|---|---|
| CN | 1953036 A | 4/2007 |
| CN | 101577103 A | 11/2009 |
| KR | 10-2008-0000852 A | 1/2008 |
| KR | 10-2008-0001955 A | 1/2008 |
| KR | 10-2008-0024400 A | 3/2008 |

* cited by examiner

*Primary Examiner* — Sanghyuk Park
(74) *Attorney, Agent, or Firm* — Birch, Stewart, Kolasch & Birch, LLP

(57) ABSTRACT

Discussed are an apparatus and method for driving a liquid crystal display device, whereby the apparatus includes a data driver for driving data lines of a liquid crystal panel, setting detectable temperatures for different temperature detection time points, detecting an ambient temperature at each temperature detection time point, and outputting a gate drive voltage variation signal and a common voltage variation signal in accordance with the set and detected temperatures at each temperature detection time point, and a power supplier for varying levels of a gate drive voltage and a common voltage in accordance with the gate drive voltage variation signal and the common voltage variation signal, and supplying the gate drive voltage and common voltage to a gate driver and the liquid crystal panel, respectively.

9 Claims, 4 Drawing Sheets

APPARATUS AND METHOD FOR DRIVING LIQUID CRYSTAL DISPLAY DEVICE HAVING DATA DRIVER WITH TEMPERATURE DETECTOR

This application claims the priority benefit of Korean Patent Application No. 10-2012-0122532, filed on Oct. 31, 2012 which is hereby incorporated by reference as if fully set forth herein.

BACKGROUND OF THE INVENTION

1. Field of the Invention

Embodiments of the invention relate to an apparatus and method for driving a liquid crystal display device, which are capable of stabilizing a gate driving circuit through variation of levels of a gate driving voltage and a common voltage supplied to a liquid crystal panel in accordance with an ambient temperature, and preventing degradation of a picture quality through reduction of a level variation of an image display voltage depending on a kick-back voltage ($\Delta Vp$).

2. Discussion of the Related Art

Liquid crystal display (LCD) devices display an image using electrical and optical properties of liquid crystals. Liquid crystals exhibit different anisotropic properties in longer and shorter-axis directions of liquid crystal molecules in terms of a refractive index and a dielectric constant, and a molecular orientation and optical properties of liquid crystals may be easily controlled. Accordingly, LCD devices display an image by adjusting the orientation of liquid crystal molecules, thus controlling the light transmittance of the liquid crystals.

Such an LCD device includes a liquid crystal panel including a plurality of pixels arranged in the form of a matrix, a gate driver for driving gate lines of the liquid crystal panel, and a data driver for driving data lines of the liquid crystal panel.

Recently, a method of detecting a temperature of an LCD device or ambient temperature around the LCD device, and varying the level of a drive voltage in accordance with the detected temperature has been proposed. When the level of the drive voltage is linearly varied in accordance with the temperature of the LCD device or ambient temperature around the LCD device, it may be possible to stably drive the gate and data drive circuits of the LCD device, and to achieve an enhancement in the picture quality.

However, in a structure in which the gate drive circuit is formed at the liquid crystal panel, there is a difficulty in applying the method of varying the level of the drive voltage because thin film transistors (TFTs) of the gate drive circuit are made of amorphous silicon (a-Si). In other words, the liquid crystal panel which is of an active matrix type may have a difficulty in application thereof because the range of the voltage to operate liquid crystals is wide. Furthermore, TFTs have a large size to meet high-temperature operation characteristics thereof. For this reason, variation of current amount depending on temperature variation is increased. As a result, the gate drive circuit becomes unstable. In addition, when the level of a low drive voltage or a high drive voltage is varied, the variation width of an image display voltage depending on a kick-back voltage ($\Delta Vp$) may be increased. For this reason, degradation of picture quality caused by flicker or the like may occur.

SUMMARY OF THE INVENTION

Accordingly, embodiments of the invention are directed to an apparatus and method for driving a liquid crystal display device that substantially obviate one or more problems due to limitations and disadvantages of the related art.

An object of the invention is to provide an apparatus and method for driving a liquid crystal display device, which are capable of stabilizing a gate driving circuit through variation of levels of a gate driving voltage and a common voltage supplied to a liquid crystal panel in accordance with ambient temperature, and preventing degradation of picture quality through reduction of level variation of an image display voltage depending on a kick-back voltage ($\Delta Vp$).

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an apparatus for driving a liquid crystal display device includes a liquid crystal panel having a plurality of pixel regions, to display an image, at least one gate driver formed at the liquid crystal panel, to drive a plurality of gate lines, a data driver for driving a plurality of data lines of the liquid crystal panel, setting detectable temperatures for different temperature detection time points, detecting ambient temperature at each of the temperature detection time points, and outputting a gate drive voltage variation signal and a common voltage variation signal in accordance with the set and detected temperatures at each of the temperature detection time points, a timing controller for arranging image data input from an outside of the apparatus, supplying the arranged image data to the data driver, and controlling the at least one gate driver and the data driver, and a power supplier for varying levels of a gate drive voltage and a common voltage in accordance with the gate drive voltage variation signal and the common voltage variation signal, and supplying the level-varied gate drive voltage and the level-varied common voltage to the at least one gate driver and the liquid crystal panel, respectively.

The data driver may include at least one temperature detector for detecting the ambient temperature, and a drive voltage controller for setting detectable temperatures for different temperature detection time points, controlling the at least one temperature detector to detect the ambient temperature, and generating and outputting the gate drive voltage variation signal, the common voltage variation signal, and a hysteresis value setting signal in accordance with the ambient temperature detected at each of the temperature detection time points.

The drive voltage controller may generate the gate drive voltage variation signal to vary a level of a gate-high voltage to be inversely proportional to the detected ambient temperature. The generation of the gate drive voltage variation signal in the drive voltage controller may be executed by adding or subtracting an offset value set in accordance with the detected ambient temperature to or from a previously-output gate drive voltage variation signal, or selecting a gate drive voltage variation signal corresponding to the detected ambient temperature from a look-up table included in the drive voltage controller or an external look-up table.

The drive voltage controller may generate a common voltage variation signal to vary a level of the common voltage in proportion to the detected ambient temperature while being inversely proportional to the level of the gate-high voltage. The generation of the common voltage variation signal in the drive voltage controller may be executed by adding or subtracting a common voltage offset value set in accordance with the detected ambient temperature to or from a previously-output common voltage variation signal, or selecting a common voltage variation signal corresponding to the detected ambient temperature from the look-up table included in the drive voltage controller or an external look-up table.

The power supplier may include a DC drive voltage generator for varying a voltage level of input power supplied from the outside of the apparatus to a level of a DC drive voltage, and outputting the DC drive voltage, a gate-high voltage generator for varying the DC drive voltage to the level of the gate-high voltage according to the gate drive voltage variation signal, and supplying the gate-high voltage to the at least one gate driver under a condition that a hysteresis value according to the hysteresis value setting signal is applied to the gate-high voltage, and a common voltage generator for varying the DC drive voltage to the level of the common voltage according to the common voltage variation signal, and supplying the common voltage to common lines of the liquid crystal panel under a condition that the hysteresis value according to the hysteresis value setting signal is applied to the common voltage.

In another aspect of the invention, a method for driving a liquid crystal display device includes driving gate lines of a liquid crystal panel including a plurality of pixel regions to display an image, setting by a data driver detectable temperatures for different temperature detection time points, detecting an ambient temperature at each of the temperature detection time points, and generating a gate drive voltage variation signal and a common voltage variation signal in accordance with the set and detected temperatures at each of the temperature detection time points, and varying levels of a gate drive voltage and a common voltage in accordance with the gate drive voltage variation signal and the common voltage variation signal, and supplying the level-varied gate drive voltage and the level-varied common voltage to a gate driver to drive the gate lines and the liquid crystal panel, respectively.

The generating the gate drive voltage variation signal may include detecting the ambient temperature through at least one temperature detector, controlling the at least one temperature detector to detect the ambient temperature, in accordance with detectable temperatures set for different temperature detection time points, and generating and outputting the gate drive voltage variation signal, the common voltage variation signal, and a hysteresis value setting signal in accordance with the ambient temperature detected at each of the temperature detection time points.

The generating the gate drive voltage variation signal may include generating the gate drive voltage variation signal to vary a level of a gate-high voltage to be inversely proportional to the detected ambient temperature. The generating the gate drive voltage variation signal may be executed by adding or subtracting an offset value set in accordance with the detected ambient temperature to or from a previously-output gate drive voltage variation signal, or selecting a gate drive voltage variation signal corresponding to the detected ambient temperature from a look-up table included in the drive voltage controller or an external look-up table.

The generating the common voltage variation signal may include generating the common voltage variation signal to vary a level of the common voltage in proportion to the detected ambient temperature while being inversely proportional to the level of the gate-high voltage. The generating the common voltage variation signal may be executed by adding or subtracting a common voltage offset value set in accordance with the detected ambient temperature to or from a previously-output common voltage variation signal, or selecting a common voltage variation signal corresponding to the detected ambient temperature from the look-up table included in the drive voltage controller or an external look-up table.

The varying the level of the gate drive voltage and the level of the common voltage, and outputting the level-varied gate drive voltage and the level-varied common voltage may include varying a voltage level of input power supplied from outside to a level of a DC drive voltage, varying the DC drive voltage to the level of the gate-high voltage according to the gate drive voltage variation signal, and supplying the gate-high voltage to each gate driver of the liquid crystal panel under a condition that a hysteresis value according to the hysteresis value setting signal is applied to the gate-high voltage, and varying the DC drive voltage to the level of the common voltage according to the common voltage variation signal, and supplying the common voltage to common lines of the liquid crystal panel under a condition that the hysteresis value according to the hysteresis value setting signal is applied to the common voltage.

In the LCD device driving apparatus and method, which have the above-described features, detectable temperatures for different temperature detection time points are set, to enable determination of ambient temperature. Accordingly, it may be possible to achieve enhanced temperature detection effects and enhanced detection temperature application effects.

The gate voltage, which has a level varied in accordance with ambient temperature, is supplied to the liquid crystal panel under the condition that a hysteresis value is reflected on the gate voltage. Accordingly, it may be possible to stabilize the gate driving circuit, and to reduce the size of each TFT. Thus, the size of the gate driving circuit may be reduced.

In addition, the level of the common voltage supplied to the liquid crystal panel is varied in accordance with ambient temperature detected based on the detectable temperatures set for different temperature detection time points. Accordingly, it may be possible to reduce level variation of the image display voltage depending on a kick-back voltage ($\Delta Vp$), and to prevent degradation of picture quality.

It is to be understood that both the foregoing general description and the following detailed description of the invention are by example and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and along with the description serve to explain the principle of the invention. In the drawings.

DETAILED DESCRIPTION OF THE INVENTION

Reference will now be made in detail to the preferred embodiments of the invention, examples of which are illustrated in the accompanying drawings.

Figure 1:
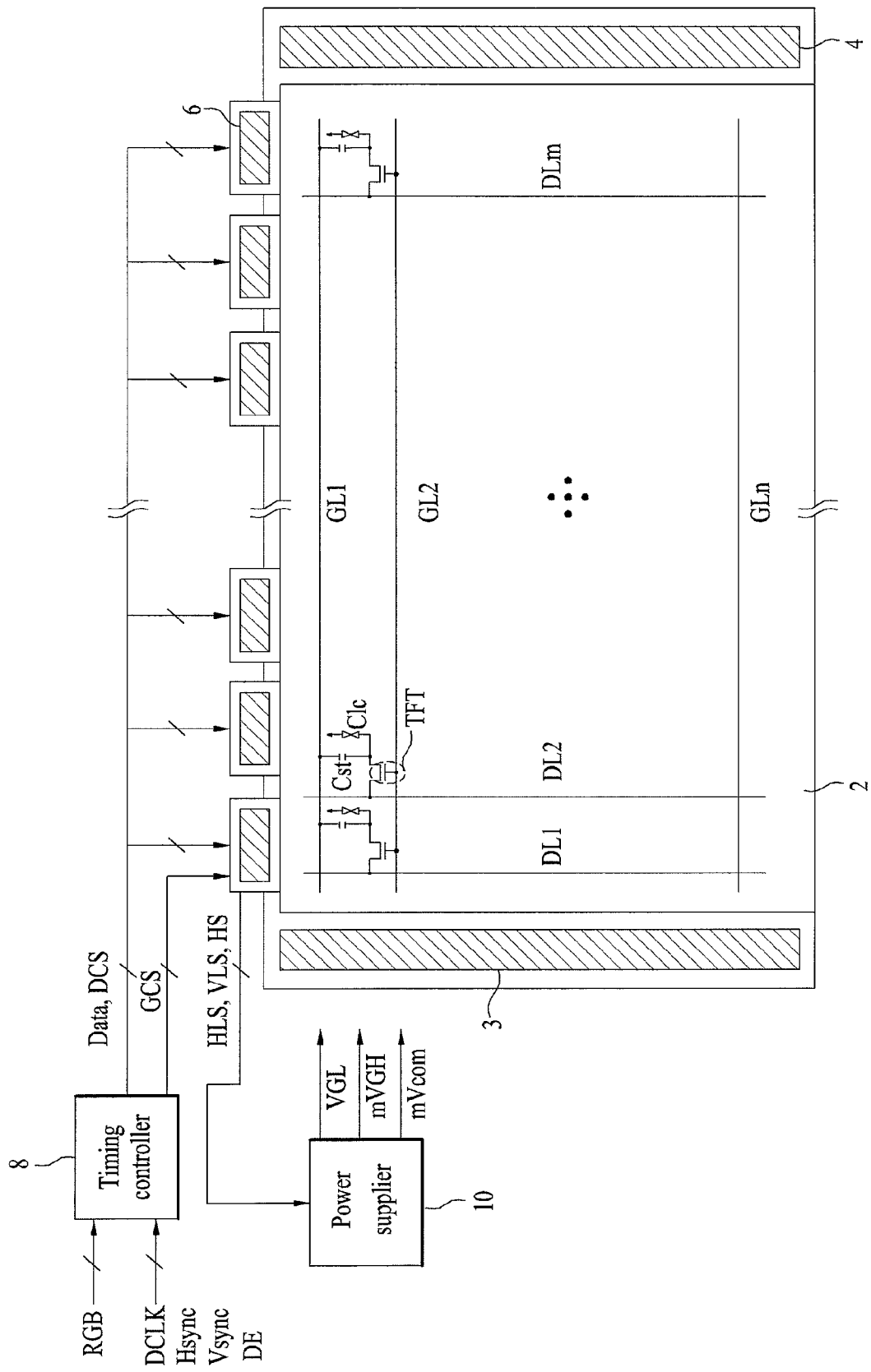
FIG. 1 is a configuration diagram illustrating an apparatus for driving a liquid crystal display (LCD) device in accordance with an example embodiment of the invention.

FIG. 1 is a configuration diagram illustrating an apparatus for driving a liquid crystal display (LCD) device in accordance with an example embodiment of the invention.

The LCD device driving apparatus illustrated in FIG. 1 includes a liquid crystal panel 2 including a plurality of pixel regions to display an image, at least one gate driver (in this example, two gate drivers 3 and 4 in the illustrated instance) formed in a non-display area of the liquid crystal panel 2, to drive a plurality of gate lines GL1 to GLn of the liquid crystal panel 2, and a data driver 6 for not only driving a plurality of data lines DL1 to DLm of the liquid crystal panel 2, but also setting detectable temperatures for different temperature detection time points, detecting ambient temperature at each of the temperature detection time points, and outputting a gate drive voltage variation signal HLS and a common voltage variation signal VLS in accordance with the set and detected temperatures at each temperature detection time point. The LCD device driving apparatus also includes a timing controller 8 for arranging image data RGB input from the outside of the apparatus, supplying the arranged image data to the data driver 6, and controlling the gate and data drivers 3, 4, and 6, and a power supplier 10 for varying levels of a gate drive voltage and a common voltage in accordance with the gate drive voltage variation signal HLS and common voltage variation signal VLS, and supplying the resultant gate drive voltage and common voltage to the gate drivers 3 and 4 and the liquid crystal panel 2, respectively.

The liquid crystal panel 2 includes a thin film transistor (TFT) formed in each of the pixel regions which are defined by the gate lines GL1 to GLn and data lines DL1 to DLm, and a liquid crystal capacitor Clc connected to the TFT. The liquid crystal capacitor Clc includes a pixel electrode connected to the TFT, and a common electrode spaced from the pixel electrode such that liquid crystals are interposed between the common electrode and the pixel electrode. The level of the common voltage is varied in accordance with the temperature set for each detection time point and ambient temperature detected at the detection time point. The varied common voltage which is designated by reference character "mVcom" is supplied to the common electrode of each pixel region. Meanwhile, the level of a gate-on voltage, for example, a scan pulse, is varied in accordance with the temperature set for each detection time point and ambient temperature detected at the detection time point, and is then sequentially supplied to the gate lines GL1 to GLn. Thus, each TFT supplies an image display voltage from an associated one of the gate lines DL1 to DLm to the associated pixel electrode in response to the scan pulse from an associated one of the gate lines GL1 to GLn.

The liquid capacitor Clc is charged with a difference voltage between the image display voltage supplied to the pixel electrode and the common voltage mVcom varied in accordance with ambient temperature, and controls light transmittance of the liquid crystals through variation of the orientation of the molecules of the liquid crystals according to the difference voltage, to realize a desired grayscale. In this instance, a storage capacitor Cst may be formed in accordance with an overlap of the pixel electrode with a storage line via an insulating film interposed between the pixel electrode and the storage line. A parasitic capacitor Cgs may be additionally formed between a source electrode of the TFT and the gate line GL associated with the TFT.

The data driver 6 is configured in the form of at least one driving integrated circuit. The data driver 6 converts the arranged data, Data, supplied from the timing controller 8 into an analog voltage, namely, an image display voltage, using data control signals DCS from the timing controller 8, for example, a source start pulse SSP, a source shift clock (SSC), a source output enable (SOE) signal, and an inversion signal (Pol signal). In detail, the data driver 6 latches the arranged data Data supplied from the timing controller 8 in accordance with the SSC, and supplies the latched data to each of the data lines DL1 to DLm as an image signal for one horizontal line at intervals of one horizontal period in which the scan pulse is supplied to one of the gate lines GL1 to GLn, in response to the SOE signal. In this instance, the data driver 6 selects a positive or negative gamma voltage corresponding to the grayscale value of the arranged data Data in accordance with the inversion signal from the timing controller 8, and supplies the selected gamma voltage to each of the data lines DL1 to DLm as an image display voltage.

Meanwhile, the at least one driving integrated circuit constituting the data driver 6 detects an ambient temperature, and controls the gate drive voltage and common voltage such that the gate drive voltage and common voltage are varied in accordance with the detected ambient temperature. In other words, the driving integrated circuit includes a temperature detector for detecting the ambient temperature. The driving integrated circuit also includes a drive voltage controller for setting detectable temperatures for different temperature detection time points, to enable the temperature detector to detect the ambient temperature, and outputting a gate drive voltage variation signal HLS and a common voltage variation signal VLS in accordance with the detected ambient temperature. Thus, the data driver 6 detects the ambient temperature detectable at each temperature detection time point, and outputs a gate drive voltage variation signal HLS and a common voltage variation signal VLS in accordance with the detected ambient temperature, to vary the gate drive voltage and common voltage.

Each of the gate drivers 3 and 4 may be formed in the non-display area of the liquid crystal panel 2. Each of the gate drivers 3 and 4 sequentially drives associated ones of the gate lines GL1 to GLn in accordance with gate control signals GCS from the timing controller 8. In detail, each of the gate drivers 3 and 4 sequentially supplies a scan pulse, which is a gate-high voltage mVGH, to the gate lines GL1 to GLn, using gate control signals GCS, for example, a gate start signal (gate start pulse (GSP)) and a gate output enable (GOE) signal. Each of the gate drivers 3 and 4 supplies a gate-low voltage in periods in which the scan pulse is not supplied. The gate-high voltage mVGH supplied to each of the gate drivers 3 and 4 is varied to a predetermined voltage level in accordance with a variation in the ambient temperature. Accordingly, the voltage level of the scan pulse output to each of the gate lines GL1 to GLn is varied to the level of the gate-high voltage mVGH, and the level-varied scan pulse is then output.

The timing controller 8 controls the data driver 6 and each of the gate drivers 3 and 4 in accordance with the image data RGB supplied from the outside of the apparatus and a plurality of synchronization signals DCLK, Hsync, Vsync, and DE. In detail, the timing controller 8 arranges the image data RGB supplied from the outside of the apparatus such that the arranged image data RGB is matched with driving of the liquid crystal panel 2, and supplies the arranged image data RGB to the data driver 6. The timing controller 8 also generates a gate control signal GCS and a data control signal DCS, using at least one of the synchronization signals supplied from the outside of the apparatus, namely, a dot clock DCLK, a data enable signal DE, a horizontal synchronization signal Hsync, and a vertical synchronization signal Vsync, and supplies the gate control signal GCS and data control signal DCS to the gate drivers 3 and 4 and the data driver 6, respectively. In this instance, the timing controller 8 controls the data driver 6 such that each pixel region formed at the liquid crystal panel 2 is driven in at least one of a line inversion manner, a column inversion manner, a frame inversion manner, and a dot inversion manner.

The power supplier 10 varies a voltage level of input power to various voltage levels, and swings each of the resultant voltages at intervals of a predetermined period, to output the voltages in the form of clock pulses. Thus, the power supplier 10 generates a positive DC drive voltage, a supply voltage, a gate-low voltage VGL, and gamma voltages of different levels. The power supplier 10 also varies the positive DC drive voltage to the level of the gate-high voltage mVGH in accordance with the gate drive voltage variation signal HLS from the data driver 6, and supplies the level-varied voltage, namely, the gate-high voltage mVGH, to each of the gate drivers 3 and 4. In addition, the power supplier 10 varies the DC drive voltage to the level of the common voltage mVcom in accordance with the common voltage variation signal VLS from the data driver 6, and supplies the level-varied voltage, namely, the common voltage mVcom, to a common voltage common line and the common electrodes.

Figure 2:
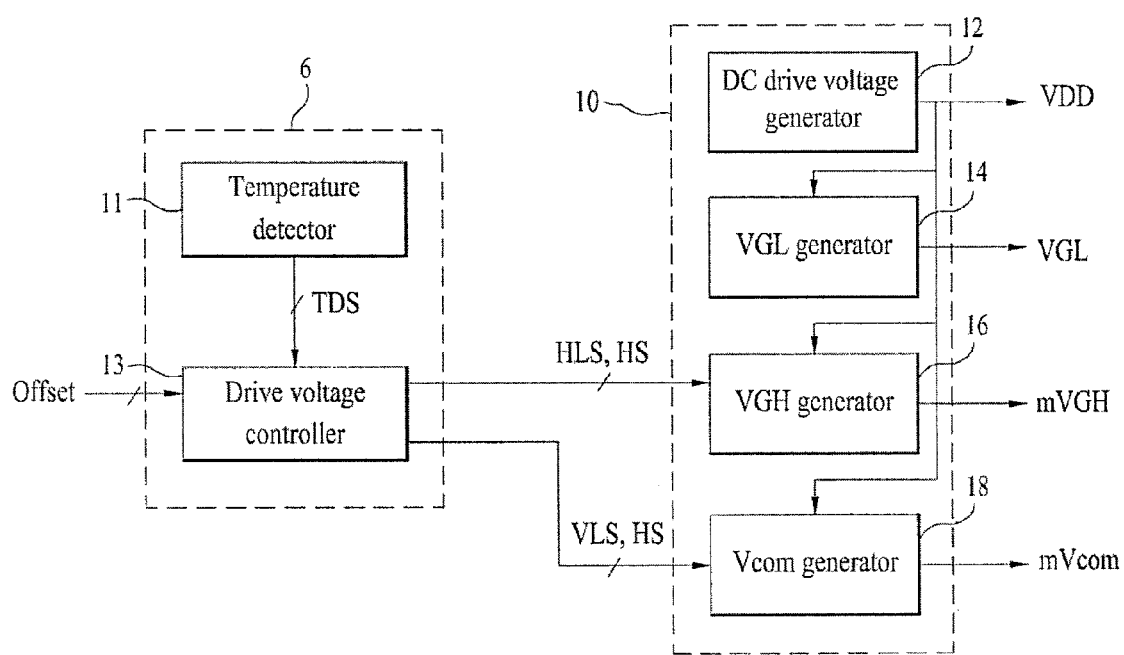
FIG. 2 is a block diagram illustrating, in brief, a data driver and a power supplier which are illustrated in FIG. 1.
Figure 3:
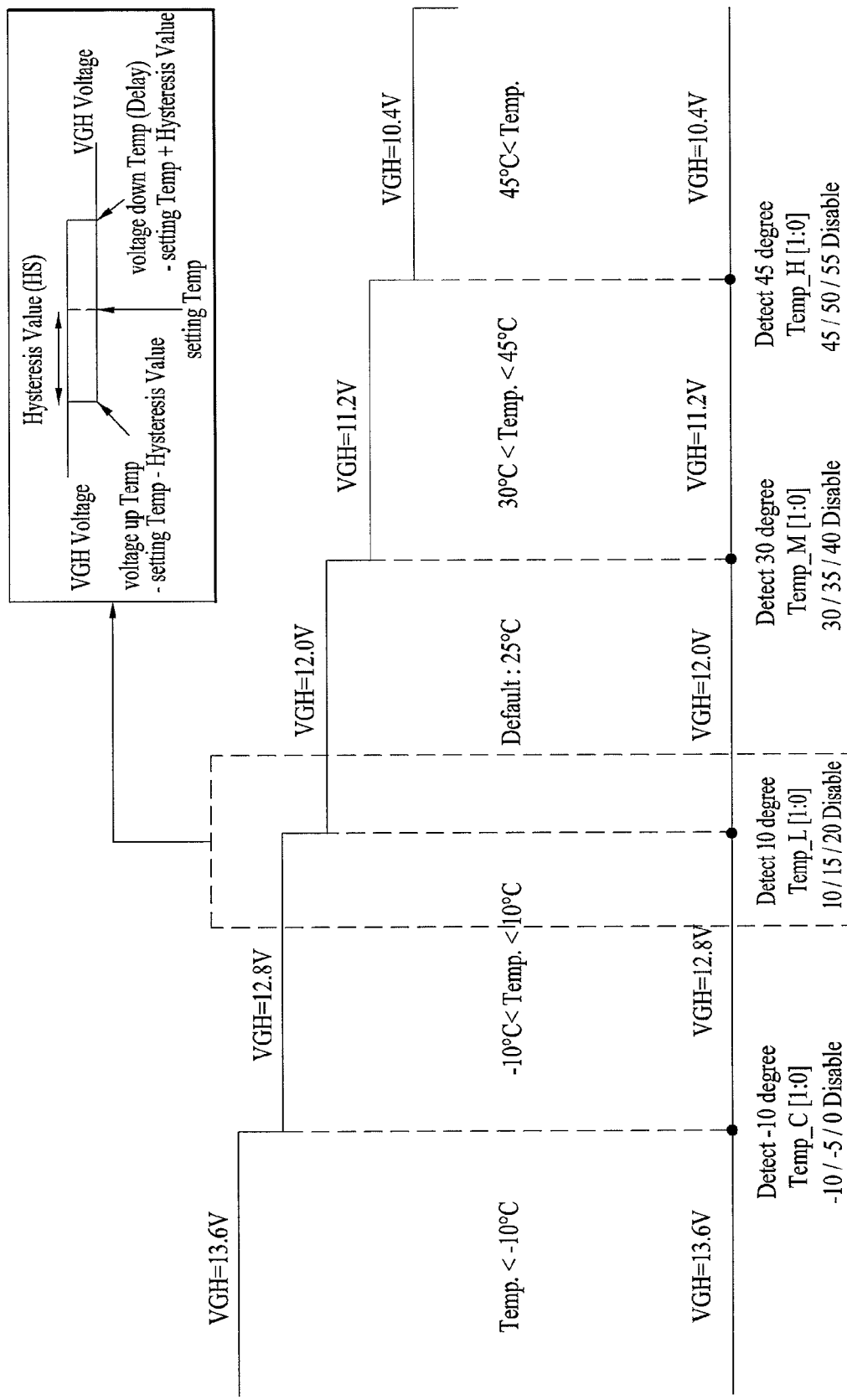
FIG. 3 is a diagram explaining a gate-high voltage variation method carried out in a drive voltage controller and a gate-high voltage generator which are illustrated in FIG. 2.

FIG. 2 is a block diagram illustrating, in brief, the data driver and power supplier illustrated in FIG. 1. FIG. 3 is a diagram explaining a gate-high voltage variation method carried out in the drive voltage controller and a gate-high voltage generator which are illustrated in FIG. 2.

The data driver 6 illustrated in FIG. 2 includes at least one temperature detector 11 for detecting an ambient temperature. The data driver 6 also includes a drive voltage controller 13 for setting detectable temperatures for different temperature detection time points, and controlling the at least one temperature detector 11 to detect the ambient temperature. The drive voltage controller 13 also generates and outputs the gate drive voltage variation signal HLS, the common voltage variation signal VLS, and a hysteresis value setting signal HS in accordance with the ambient temperature detected at each temperature detection time point.

The temperature detector 11 includes at least one temperature sensor. The temperature detector 11 detects the ambient temperature on a real-time basis under a control of the drive voltage controller 13, or detects the ambient temperature in response to a detection control signal, and then supplies a temperature detection signal TDS according to the detected temperature to the drive voltage controller 13. The temperature detector 11 may be internally provided at the data driver 6. If necessary, the temperature detector 11 may be arranged at the outside of the data driver 6.

The drive voltage controller 13 previously sets and stores different temperature detection time points corresponding to a variation of the ambient temperature, and detectable temperatures for the temperature detection time points. Accordingly, the drive voltage controller 13 outputs detection control signals at respective temperature detection time points corresponding to the variation of the ambient temperature, and receives temperature detection signals TDS corresponding to the respective temperature detection time points. The drive voltage controller 13 also detects an accurate current ambient temperature at each temperature detection time point, based on the detectable temperatures at the temperature detection time point and the detected temperature according to the temperature detection signal TDS at the temperature detection time point.

The drive voltage controller 13 generates a gate drive voltage variation signal HLS to vary the level of the gate-high voltage such that the gate-high voltage corresponds to the detected current ambient temperature, and a common voltage variation signal VLS to vary the level of the common voltage such that the common voltage corresponds to the detected current ambient temperature. The drive voltage controller 13 also generates a hysteresis value corresponding to a difference between the previously-detected ambient temperature and the currently-detected ambient temperature, and a hysteresis value setting signal HS for setting of the hysteresis value.

The power supplier 10 illustrated in FIG. 2 includes a DC drive voltage generator 12 for varying the voltage level of an input power supplied from the outside of the apparatus to the level of a positive DC drive voltage VDD, and outputting the level-varied voltage, a gate-low voltage generator 14 for varying the DC drive voltage VDD from the DC drive voltage generator 12 to the level of the gate-low voltage VGL, and supplying the level-varied voltage to the gate drivers 3 and 4, and a gate-high voltage generator 16 for varying the DC drive voltage VDD to the level of the gate-high voltage mVGH according to the gate drive voltage variation signal HLS, and supplying the level-varied voltage, namely, the gate-high voltage mVGH, to the gate drivers 3 and 4 under the condition that the hysteresis value according to the hysteresis value setting signal HS is applied to the gate-high voltage mVGH. The power supplier 10 also includes a common voltage generator 18 for varying the DC drive voltage VDD to the level of the common voltage mVcom according to the common voltage variation signal VLS, and supplying the level-varied voltage, namely, the common voltage mVcom, to common lines of the liquid crystal panel 2 under the condition that the hysteresis value according to the hysteresis value setting signal HS is applied to the common voltage mVcom.

Hereinafter, a method for driving the drive voltage controller 13 and gate-high voltage generator 16 will be described with reference to FIG. 3.

As illustrated in FIG. 3 and the following Table 1, the drive voltage controller 13 previously sets and stores different temperature detection time points and detectable temperatures for the temperature detection time points.

TABLE 1

| Temperature Detecting for Temp. Cold | Temperature Detecting for Temp. Low | Temperature Detecting for Temp. Middle | Temperature Detecting for Temp. High |
|---|---|---|---|
| Temp__C[1:0] | Temp__L[1:0] | Temp__M[1:0] | Temp__H[1:0] |
| 00 = −10° C. | 00 = 10° C. | 00 = 30° C. | 00 = 45° C. |
| 00 = −5° C. | 00 = 15° C. | 00 = 35° C. | 00 = 50° C. |
| 00 = 0° C. | 00 = 20° C. | 00 = 40° C. | 00 = 55° C. |
| 11 = Disable | 11 = Disable | 11 = Disable | 11 = Disable |

The drive voltage controller 13 outputs a detect control signal at each temperature detection time point, to receive a temperature detection signal TDS from the temperature detector 11. The drive voltage controller 13 then determines the accurate current ambient temperature at each temperature detection time point, based on the detectable temperature and temperature detection signal TDS at the temperature detection time point.

The drive voltage controller 13 generates a gate drive voltage variation signal HLS to vary the level of the gate-high voltage mVGH (or VGH) to be inversely proportional to the detected current ambient temperature. That is, the drive voltage controller 13 generates the gate drive voltage variation signal HLS to vary the level of the gate-high voltage mVGH such that the gate-high voltage mVGH has a lowered level when the detected current ambient temperature is increased (going right in FIG. 3), and has an increased level when the detected current ambient temperature is lowered (going left in FIG. 3). At a high ambient temperature, the TFTs exhibit better driving characteristics. Accordingly, the gate drive voltage variation signal HLS is adapted to vary the level of the drive voltage to be lowered when the ambient temperature is increased.

Generation of the gate drive voltage variation signal HLS in the drive voltage controller 13 may be achieved by adding or subtracting an offset value set in accordance with the detected ambient temperature to or from a previously-output gate drive voltage variation signal HLS, or selecting a gate drive voltage variation signal HLS corresponding to the detected ambient temperature from a look-up table included in the drive voltage controller 13 or an external look-up table.

In detail, as illustrated in the following Table 2, the drive voltage controller 13 previously sets offset values for variation of the level of the gate drive voltage mVGH and variation of the gate drive voltage variation signal HLS. Accordingly, the drive voltage controller 13 may add or subtract an offset value to or from the previously-output gate drive voltage variation signal HLS and gate-high voltage mVGH.

TABLE 2

| Voltage add step setting for Temp. Cold Add_Volt_C[3:0] = A2_C | Voltage add step setting for Temp. Low Add_Volt_C[3:0] = A2_L | Voltage add step setting for Temp. Middle Add_Volt_C[3:0] = A2_M | Voltage add step setting for Temp. High Add_Volt_C[3:0] = A2_H |
|---|---|---|---|
| 4'h0 = No Change | 4'h0 = No Change | 4'h0 = No Change | 4'h0 = No Change |
| 4'h1 = 0.2 V | 4'h1 = 0.2 V | 4'h1 = 0.2 V | 4'h1 = 0.2 V |
| 4'h2 = 0.4 V | 4'h2 = 0.4 V | 4'h2 = 0.4 V | 4'h2 = 0.4 V |
| 4'h3 = 0.6 V | 4'h3 = 0.6 V | 4'h3 = 0.6 V | 4'h3 = 0.6 V |
| ... | ... | ... | ... |
| 4'hD = 2.6 V | 4'hD = 2.6 V | 4'hD = 2.6 V | 4'hD = 2.6 V |
| 4'hE = 2.8 V | 4'hE = 2.8 V | 4'hE = 2.8 V | 4'hE = 2.8 V |
| 4'hF = 3.0 V | 4'hF = 3.0 V | 4'hF = 3.0 V | 4'hF = 3.0 V |

For example, the drive voltage controller 13 previously sets offset values having increments of 0.2V for different detectable temperatures. In this instance, the level of the gate-high voltage mVGH may be increased or lowered by an offset value increment or decrement of 0.2V in accordance with the detected temperature.

In an embodiment of the invention, each offset value for the gate-high voltage mVGH is set to cause the level of the gate-high voltage mVGH to be inversely proportional to the detected ambient temperature corresponding to the offset value.

On the other hand, as illustrated in the following Table 3, the drive voltage variation signal HLS may be generated, using a look-up table included in the drive voltage controller 13 or an external look-up table.

TABLE 3

| VGH Voltage VBHx[5:0] = A1 + A2 |
|---|
| 00h = 8.0 V |
| 01h = 8.2 V |
| 02h = 8.4 V |
| . |
| 0Fh = 11.0 V |
| 10h = 11.2 V |

TABLE 3-continued

| VGH Voltage VBHx[5:0] = A1 + A2 |
|---|
| 11h = 11.4 V |
| 12h = 11.6 V |
| 13h = 11.8 V |
| 14h = 12.0 V |
| . |
| 1Fh = 14.2 V |
| 10h = 14.4 V |
| 11h = 14.6 V |
| . |
| 2Fh = 17.4 V |
| 30h = 17.6 V |
| 31h = 17.8 V |
| 32h = 18.0 |
| 33h~3Fh reserved |

When the look-up table is used, different gate high voltage levels for different detectable temperatures are previously stored, and a gate drive voltage variation signal HLS corresponding to a detected temperature or a gate-high voltage mVGH having a level corresponding to the detected temperature is selected from the look-up table, to generate the gate drive voltage variation signal HLS or the gate-high voltage mVGH having the selected level.

In an embodiment of the invention, the look-up table is set to cause the level of the gate-high voltage mVGH to be inversely proportional to the detected ambient temperature corresponding to the offset value.

Hereinafter, a method for driving the drive voltage controller 13 and common voltage generator 18 will be described with reference to FIG. 4.

Figure 4:
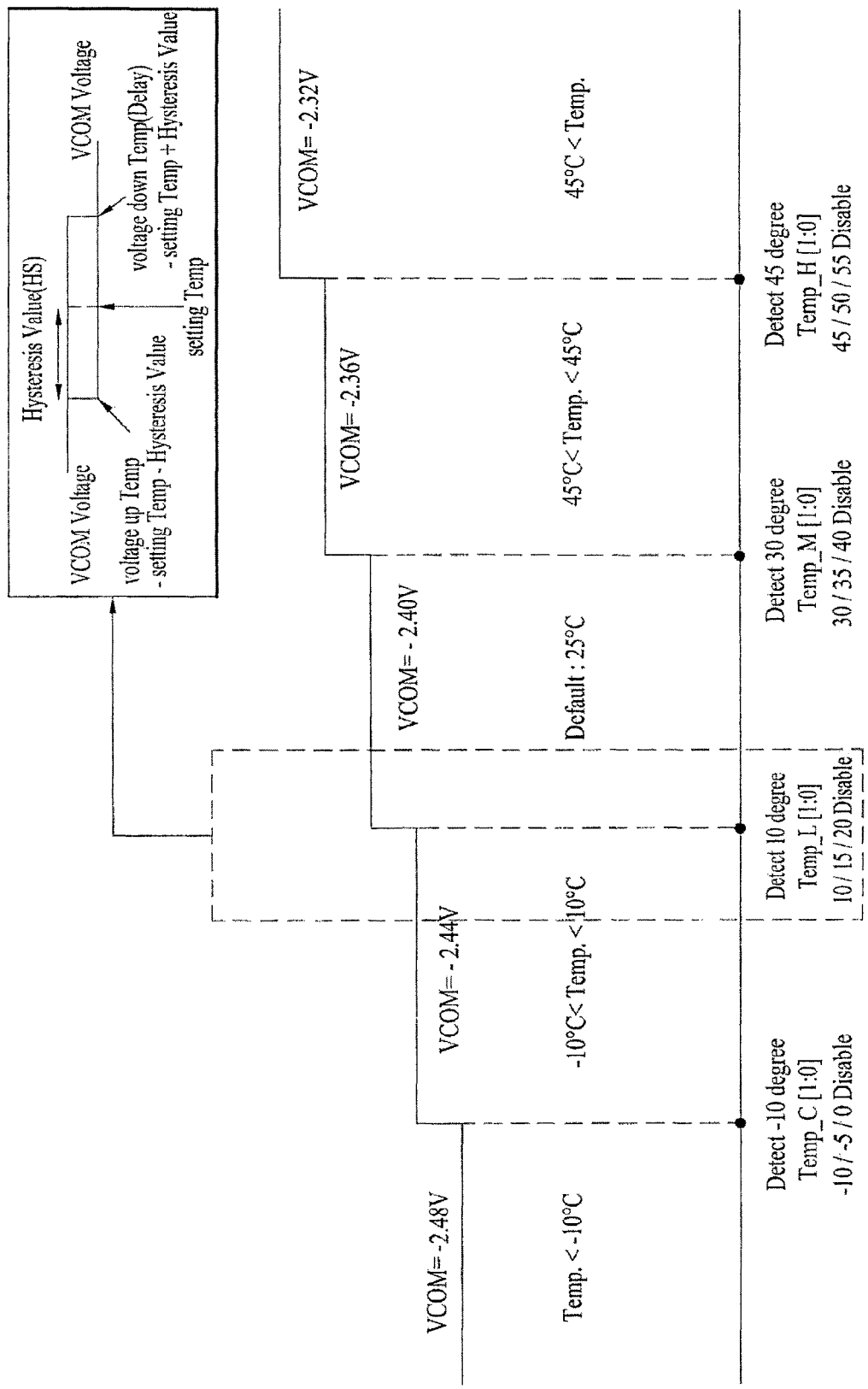
FIG. 4 is a diagram explaining a common voltage variation method carried out in the drive voltage controller and a common voltage generator which are illustrated in FIG. 2.

As illustrated in FIG. 4 and Table 1, the drive voltage controller 13 generates a common voltage variation signal VLS to vary the level of the common voltage mVcom (or VCOM) in proportion to variation of the detected current ambient temperature while being inversely proportional to the level of the gate-high voltage mVGH (or VGH). That is, the drive voltage controller 13 generates the common voltage variation signal VLS to vary the level of the common voltage mVcom such that the common voltage mVcom has a lowered level when the gate-high voltage mVGH has an increased level (going left on FIG. 4), and has an increased level when the gate-high voltage mVGH has a lowered level (going right on FIG. 4).

The level of the common voltage mVcom should be varied to be inversely proportional to the level of the gate-high voltage mVGH in order to minimize variation of the image display voltage caused by a kick-back voltage (ΔVp) generated due to a difference between the gate-high voltage mVGH and the gate-low voltage VGL.

To this end, the drive voltage controller 13 generates the gate drive voltage variation signal HLS by adding or subtracting an offset value set in accordance with the detected ambient temperature to or from a previously-output common voltage variation signal VLS, or selecting a common voltage variation signal VLS corresponding to the detected ambient temperature from a look-up table included in the drive voltage controller 13 or an external look-up table.

In detail, as illustrated in the following Table 4, the drive voltage controller 13 previously sets offset values for variation of the level of the common voltage mVcom and variation of the common voltage variation signal VLS. Accordingly, the drive voltage controller 13 may add or subtract a common voltage offset value to or from the common voltage mVcom and common voltage variation signal VLS.

TABLE 4

| Voltage add step setting for Temp. Cold Add_Volt_C[3:0] = A2_C | Voltage add step setting for Temp. Low Add_Volt_C[3:0] = A2_L | Voltage add step setting for Temp. Middle Add_Volt_C[3:0] = A2_M | Voltage add step setting for Temp. High Add_Volt_C[3:0] = A2_H |
|---|---|---|---|
| 6'h0 = No Change | 6'h0 = No Change | 6'h0 = No Change | 6'h0 = No Change |
| 6'h01 = 20 mV | 6'h01 = 20 mV | 6'h01 = 20 mV | 6'h01 = 20 mV |
| 6'h02 = 40 mV | 6'h02 = 40 mV | 6'h02 = 40 mV | 6'h02 = 40 mV |
| ... | ... | ... | ... |
| 6'h0F = 300 mV | 6'h0F = 300 mV | 6'h0F = 300 mV | 6'h0F = 300 mV |
| 6'h10 = 320 mV | 6'h10 = 320 mV | 6'h10 = 320 mV | 6'h10 = 320 mV |
| ... | ... | ... | ... |
| 6'h1F = 620 mV | 6'h1F = 620 mV | 6'h1F = 620 mV | 6'h1F = 620 mV |
| 6'h20 = No Change | 6'h20 = No Change | 6'h20 = No Change | 6'h20 = No Change |
| 6'h21 = −20 mV | 6'h21 = −20 mV | 6'h21 = −20 mV | 6'h21 = −20 mV |
| 6'h22 = −40 mV | 6'h22 = −40 mV | 6'h22 = −40 mV | 6'h22 = −40 mV |
| ... | ... | ... | ... |
| 6'h2F = −300 mV | 6'h2F = −300 mV | 6'h2F = −300 mV | 6'h2F = −300 mV |
| 6'h30 = −320 mV | 6'h30 = −320 mV | 6'h30 = −320 mV | 6'h30 = −320 mV |
| ... | ... | ... | ... |
| 6'h4F = −620 mV | 6'h4F = −620 mV | 6'h4F = −620 mV | 6'h4F = −620 mV |

For example, the drive voltage controller 13 previously sets offset values having increments of 20 mV for different detectable temperatures. In this instance, the level of the common voltage mVcom may be increased or lowered by an offset value increment or decrement of 20 mV in accordance with the detected temperature.

In an embodiment of the invention, each offset value for the common voltage mVcom is set to cause the level of the common voltage mVcom to be proportional to the detected ambient temperature corresponding to the offset value.

On the other hand, as illustrated in the following Table 5, the common voltage variation signal VLS may be generated, using a look-up table included in the drive voltage controller 13 or an external look-up table.

TABLE 5

| mVcom Voltage VCM[7:0] = A1 + A2 |
|---|
| 00h = 0 mV |
| 01h = −500 mV |
| 0Fh = −780 mV |
| 10h = −800 mV |
| 1Fh = −1.10 V |
| 20h = −1.12 V |
| 2Fh = −1.42 V |
| 30h = −1.44 V |
| 3Fh = −1.74 V |
| 40h = −1.76 V |
| 4Fh = −2.06 V |
| 50h = −2.08 V |
| 5Fh = −2.38 V |
| 60h = −2.40 V |
| 6Fh = −2.70 V |
| 70h = −2.72 V |
| 7Fh = −3.02 V |
| 80h = −3.04 V |
| 8Fh = −3.34 V |
| 90h = −3.36 V |
| 9Fh = −3.66 V |
| A0 = −3.68 V |
| AFh = −3.98 V |
| B0h = −4.00 V |
| B1h ~ FE reserved |
| FFh = VCOMR |

When the look-up table is used, different common voltage levels for different detectable temperatures are previously stored, and a common voltage variation signal VLS corresponding to a detected temperature or a common voltage mVcom having a level corresponding to the detected temperature is selected from the look-up table, to generate the common voltage variation signal VLS or the common voltage mVcom having the selected level.

Preferably, the look-up table is set to cause the level of the common voltage mVcom to be proportional to the detected ambient temperature corresponding to the offset value.

Meanwhile, the drive voltage controller 13 generates a hysteresis value corresponding to a difference between the previously-detected ambient temperature and the currently-detected ambient temperature, and a hysteresis value setting signal HS to set the hysteresis value. The drive voltage controller 13 supplies the hysteresis value and the hysteresis value setting signal HS to the gate-high voltage generator 16 and common voltage generator 18.

Accordingly, the gate-high voltage generator 16 varies the level of the gate-high voltage mVGH in accordance with the gate drive voltage variation signal HLS. The gate-high voltage generator 16 then supplies the level-varied gate-high voltage mVGH to the gate drivers 3 and 4 under the condition that the hysteresis value according to the hysteresis value setting signal HS is applied to the gate-high voltage mVGH.

Meanwhile, the common voltage generator 18 varies the level of the common voltage mVcom in accordance with the common voltage variation signal VLS. The common voltage generator 18 then supplies the level-varied common voltage mVcom to the common lines of the liquid crystal panel 2 under the condition that the hysteresis value according to the hysteresis value setting signal HS is applied to the common voltage mVcom.

As apparent from the above description, in the LCD device driving apparatus and method according to the illustrated embodiments, which have the above-described features, detectable temperatures for different temperature detection time points are set, to enable determination of the ambient temperature. Accordingly, it may be possible to achieve enhanced temperature detection effects and enhanced detection temperature application effects. The gate voltage, which has a level varied in accordance with the ambient temperature, is supplied to the liquid crystal panel under the condition that a hysteresis value is reflected on the gate voltage. Accordingly, it may be possible to stabilize the gate driving circuit, and to reduce the size of each TFT. Thus, the size of the gate driving circuit may be reduced.

In addition, the level of the common voltage supplied to the liquid crystal panel is varied in accordance with the ambient temperature detected based on the detectable temperatures set for different temperature detection time points. Accordingly, it may be possible to reduce level variation of the image display voltage depending on a kick-back voltage ($\Delta Vp$), and to prevent degradation of picture quality.

It will be apparent to those skilled in the art that various modifications and variations can be made in the invention without departing from the spirit or scope of the inventions. Thus, it is intended that the invention covers the modifications and variations of this invention provided they come within the scope of the appended claims and their equivalents.

What is claimed is:

1. An apparatus for driving a liquid crystal display device, the apparatus comprising:
    a liquid crystal panel having a plurality of pixel regions, and configured to display an image;
    at least one gate driver at the liquid crystal panel, and configured to drive a plurality of gate lines of the liquid crystal panel;
    a data driver configured to drive a plurality of data lines of the liquid crystal panel;
    a timing controller configured to arrange image data input from an outside of the apparatus, supply an arranged image data to the data driver, and control the at least one gate driver and the data driver; and
    a power supplier to vary levels of a gate drive voltage and a common voltage in accordance with a gate drive voltage variation signal and a common voltage variation signal, and supply a level-varied gate drive voltage to the at least one gate driver, and supply a level-varied common voltage to common lines of the liquid crystal panel,
    wherein the data driver comprises:
    at least one temperature detector configured to detect an ambient temperature; and
    a drive voltage controller configured to set detectable temperatures for different temperature detection time points, control the at least one temperature detector to detect the ambient temperature, and generate and output the gate drive voltage variation signal, the common voltage variation signal, a hysteresis value, and a hysteresis value setting signal in accordance with the ambient temperature detected at each of the temperature detection time points,
    wherein the power supplier comprises:
    a DC drive voltage generator configured to vary a voltage level of input power supplied from the outside of the apparatus to a DC drive voltage, and output the DC drive voltage;
    a gate-low voltage generator configured to vary the DC drive voltage to a gate-low voltage, and supply the gate-low voltage to the at least one gate driver;
    a gate-high voltage generator configured to vary the DC drive voltage to a level of a gate-high voltage according to the gate drive voltage variation signal, and supply a level-varied gate-high voltage to the at least one gate driver under a condition that the hysteresis value according to the hysteresis value setting signal is applied to the level-varied gate-high voltage; and
    a common voltage generator configured to vary the DC drive voltage to a level of a common voltage according to the common voltage variation signal, and supply a level-varied common voltage to the common lines of the liquid crystal panel under a condition that the hysteresis value according to the hysteresis value setting signal is applied to the level-varied common voltage, and
    wherein the drive voltage controller generates the hysteresis value to correspond to a difference between a previously-detected ambient temperature and a currently-detected ambient temperature.

2. The apparatus according to claim 1, wherein:
    the drive voltage controller generates the gate drive voltage variation signal to vary the level of the gate-high voltage to be inversely proportional to the ambient temperature; and
    the drive voltage controller generates the gate drive voltage variation signal by adding or subtracting an offset value set in accordance with the ambient temperature to or from a previously-output gate drive voltage variation signal, or selecting a gate drive voltage variation signal corresponding to the ambient temperature from a look-up table included in the drive voltage controller or an external look-up table.

3. The apparatus according to claim 1, wherein:
    the drive voltage controller generates the common voltage variation signal to vary the level of the common voltage in proportion to the ambient temperature while being inversely proportional to the level of the gate-high voltage; and
    the drive voltage controller generates the common voltage variation signal by adding or subtracting a common voltage offset value set in accordance with the ambient temperature to or from a previously-output common voltage variation signal, or selecting a common voltage variation signal corresponding to the ambient temperature from a look-up table included in the drive voltage controller or an external look-up table.

4. A method for driving a liquid crystal display device, the method comprising:
    setting detectable temperatures for different temperature detection time points, detecting an ambient temperature at each of the temperature detection time points, and generating a gate drive voltage variation signal, a common voltage variation signal, a hysteresis value, and a hysteresis value setting signal in accordance with the ambient temperatures detected at each of the temperature detection time points;

varying a voltage level of input power supplied from an outside to a DC drive voltage, and outputting the DC drive voltage;

varying the DC drive voltage to a gate-low voltage, and outputting the gate-low voltage;

varying the DC drive voltage to a level of a gate-high voltage according to the gate drive voltage variation signal, and outputting a level-varied gate-high voltage under a condition that the hysteresis value according to the hysteresis value setting signal is applied to the level-varied gate-high voltage;

varying the DC drive voltage to a level of a common voltage according to the common voltage variation signal, and outputting a level-varied common voltage under a condition that the hysteresis value according to the hysteresis value setting signal is applied to the level-varied common voltage; and driving gate lines and common lines of a liquid crystal panel according to the gate-low voltage, the level-varied gate-high voltage and the level-varied common voltage, wherein the hysteresis value is generated to correspond to a difference between a previously-detected ambient temperature and a currently-detected ambient temperature.

5. The method according to claim 4, wherein generating of the gate drive voltage variation signal comprises;

varying the level of the gate-high voltage to be inversely proportional to the ambient temperature; and adding or subtracting an offset value set in accordance with the ambient temperature to or from a previously-output gate drive voltage variation signal, or selecting a gate drive voltage variation signal corresponding to the ambient temperature from a look-up table.

6. The method according to claim 4, wherein generating of the common voltage variation signal comprises;

generating the common voltage variation signal to vary the level of the common voltage in proportion to the ambient temperature while being inversely proportional to the level of the gate-high voltage; and adding or subtracting a common voltage offset value set in accordance with the ambient temperature to or from a previously-output common voltage variation signal, or selecting a common voltage variation signal corresponding to the detected ambient temperature from a look-up table.

7. An apparatus for driving a liquid crystal display device, the apparatus comprising:

a liquid crystal panel having a plurality of gate lines and a plurality of data lines;

at least one gate driver on the liquid crystal panel to drive the plurality of gate lines;

a data driver configured to drive the plurality of data lines of the liquid crystal panel;

a timing controller configured to arrange image data input from an outside of the apparatus, supply an arranged image data to the data driver, and control the at least one gate driver and the data driver;

at least one temperature detector configured to detect an ambient temperature;

a drive voltage controller configured to set detectable temperatures for different temperature detection time points, control the at least one temperature detector to detect the ambient temperature, and generate and output a gate drive voltage variation signal, a common voltage variation signal, a hysteresis value, and a hysteresis value setting signal in accordance with the ambient temperature detected at each of the temperature detection time points;

a DC drive voltage generator configured to vary a voltage level of input power supplied from the outside of the apparatus to a DC drive voltage, and output the DC drive voltage;

a gate-low voltage generator configured to vary the DC drive voltage to a gate-low voltage, and supply the gate-low voltage to the at least one gate driver;

a gate-high voltage generator configured to vary the DC drive voltage to a level of a gate-high voltage according to the gate drive voltage variation signal, and supply a level-varied gate-high voltage to the at least one gate driver under a condition that the hysteresis value according to the hysteresis value setting signal is applied to the level-varied gate-high voltage; and a common voltage generator configured to vary the DC drive voltage to a level of a common voltage according to the common voltage variation signal, and supplying the level-varied common voltage to the common lines of the liquid crystal panel under a condition that the hysteresis value according to the hysteresis value setting signal is applied to the level-varied common voltage, wherein the hysteresis value is generated to correspond to a difference between a previously detected ambient temperature and a currently-detected ambient temperature.

8. The apparatus according to claim 7, wherein:

the drive voltage controller generates the gate drive voltage variation signal to vary the level of the gate-high voltage to be inversely proportional to the detected ambient temperature; and the drive voltage controller generates the gate drive voltage variation signal by adding or subtracting an offset value set in accordance with the ambient temperature to or from a previously-output gate drive voltage variation signal, or selecting a gate drive voltage variation signal corresponding to the detected ambient temperature from a look-up table.

9. The apparatus according to claim 7, wherein:

the drive voltage controller generates a common voltage variation signal to vary the level of the common voltage in proportion to the ambient temperature while being inversely proportional to the level of the gate-high voltage; and the drive voltage controller generates the common voltage variation signal by adding or subtracting a common voltage offset value set in accordance with the ambient temperature to or from a previously-output common voltage variation signal, or selecting a common voltage variation signal corresponding to the detected ambient temperature from a look-up table.

* * * * *